United States Patent [19]
Tuttle

[11] Patent Number: 5,275,715
[45] Date of Patent: Jan. 4, 1994

[54] ELECTROPLATING PROCESS FOR ENHANCING THE CONFORMALITY OF TITANIUM AND TITANIUM NITRIDE FILMS IN THE MANUFACTURE OF INTEGRATED CIRCUITS AND STRUCTURES PRODUCED THEREBY

[75] Inventor: Mark E. Tuttle, Boise, Id.
[73] Assignee: Micron Technology Inc., Boise, Id.
[21] Appl. No.: 824,316
[22] Filed: Jan. 23, 1992
[51] Int. Cl.$^5$ ................... C23C 28/00; H01L 21/288
[52] U.S. Cl. ........................... 205/123; 205/157; 205/186; 205/224; 437/192; 437/245
[58] Field of Search .............. 205/123, 124, 157, 186, 205/224; 437/245, 192, 196, 200

[56] References Cited

U.S. PATENT DOCUMENTS

| | | | |
|---|---|---|---|
| 3,953,266 | 4/1976 | Takai | 156/11 |
| 4,011,144 | 3/1977 | Bachman | 204/15 |
| 4,432,839 | 2/1984 | Kline | 204/12 |

*Primary Examiner*—John Niebling
*Assistant Examiner*—William T. Leader
*Attorney, Agent, or Firm*—William J. Bethurum

[57] ABSTRACT

Highly conformal layers of either titanium, Ti, titanium nitride, TiN, or titanium oxide, $TiO_x$, are formed on exposed surfaces of silicon substrates by first forming a very thin chemical vapor deposition (CVD) layer of either doped polysilicon or a chosen metallic silicide, such as titanium silicide, tungsten silicide, tantalum silicide, or molybdenum silicide on the exposed silicon surfaces and any masking material remaining thereon. Thereafter, the layered structure is transferred to an electroplating bath wherein a layer of titanium is plated on the surfaces of the metallic silicide film using either an aqueous electroplating solution, a non-aqueous solution or a molten salt solution. Then, the structure is transferred to either an anneal furnace or to a rapid thermal processor (RTP) and heated to a predetermined elevated temperature for a predetermined time in the presence of nitrogen, using either nitrogen gas, $N_2$, or ammonia, $NH_3$, to form a titanium nitride film and an underlying metal-silicon interface having a good contact resistance at the silicon substrate surface. Alternatively, titanium oxide, $TiO_x$, films may be formed in an oxygen ambient as an excellent etch stop material, or the vias may be completely electroplated with titanium, Ti, and then annealed with no nitrogen or oxygen present in the anneal furnace or rapid thermal processor.

13 Claims, 1 Drawing Sheet

ELECTROPLATING PROCESS FOR ENHANCING THE CONFORMALITY OF TITANIUM AND TITANIUM NITRIDE FILMS IN THE MANUFACTURE OF INTEGRATED CIRCUITS AND STRUCTURES PRODUCED THEREBY

TECHNICAL FIELD

This invention relates generally to the formation of electrical contacts and conductive layers for integrated circuits, and more particularly to a new and improved method of forming titanium and titanium nitride layers on silicon substrates with significantly improved conformality relative to any known prior art.

BACKGROUND ART

In the manufacture of silicon integrated circuits used in the construction of dynamic random access memories (DRAMs), static random access memories (SRAMs), and the like, certain types of multi-level conductor (MLC) interconnects are required to provide the necessary electrical paths between MOS transistors and other devices fabricated in the silicon substrate and the external circuitry used for passing data to and from these devices. As the device packing density for these integrated circuits is increased in accordance with the corresponding increased demands on function and performance of the integrated circuit chip, it becomes necessary to optimize and maximize the conformality of the various deposited layers of materials used in building up the completed integrated circuit structure from the surface of the silicon substrate to the top layer or layers of conductor thereof. This demand for increased layer conformality is not only related to an improved overall component packing density, but it is also related to improving the overall reliability and performance of the various electrical conductors which form the required electrical paths within the integrated circuit chip.

The term "conformality" as used herein refers to the degree to which a deposited layer conforms to the exact surface contour of the underlying surface on which the deposited layer is formed. Thus, when depositing layers of metal on a silicon substrate in which openings have been etched in either a surface mask layer or the silicon substrate itself, or both, then a high degree of deposited layer conformality means that not only must the deposited metal layers conform to the horizontal upper and lower boundaries of these openings, but it must conform to the vertical sidewalls of these openings as well.

One of the preferred conductors used in manufacturing multi-level conductor interconnects is titanium nitride, TiN, which has been widely used in many diverse arts including the manufacture of integrated circuits. Titanium nitride displays an interesting combination of properties, such as optical properties that resemble those of gold and a hardness greater than all elemental metals and sapphire and almost as hard as diamond. Its melting point is almost 3000° C., which is higher than that of most materials, and it is inert to most chemicals and solvents except aqua regia which dissolves it slowly, and hydrogen fluoride (HF). In addition, titanium atoms at the silicon substrate interface form a thin layer of titanium silicide, $TiS_2$, which makes a good low resistance contact at the surface of a silicon substrate. Titanium nitride used in the manufacture of certain types of integrated circuits is disclosed in co-pending application Ser. No. 07/734,708 of Fernando Gonzalez et al, filed on Jul. 24, 1991, and in co-pending application Ser. No. 07/785,681 of Gertej S. Sandhu, filed Oct. 31, 1991, now U.S. Pat. No. 5,227,334, both assigned to the present assignee and incorporated herein by reference.

Known currently used prior art processes for forming titanium, titanium nitride, and titanium oxide films include either the use of sputtering techniques to form the titanium and titanium nitride films or the use of chemical vapor deposition (CVD) techniques to form these films. Current high density integrated circuit applications utilize very high aspect ratio contact holes and trenches which can be greater than 3:1. Consequently, prior art techniques for forming titanium, titanium nitride, and titanium oxide are not acceptable for the more advanced IC devices being built today. Sputtering processes have tended to produce very poor step coverage for these coatings, whereas CVD TiN forming techniques tend to involve the production of high contaminant levels of either chlorine or carbon or oxygen which in turn can cause various electrical problems within the integrated circuit structures being produced.

DISCLOSURE OF INVENTION

The general purpose and principal object of the present invention is to provide a new and improved process for forming conformal coatings of titanium in the manufacture of silicon integrated circuits wherein the conformality of the titanium has been greatly enhanced with respect to the above prior art processes, while simultaneously maintaining good electrical connection and low contact resistance for the titanium layers thus formed.

In accordance with the present invention, it has been discovered that these improved titanium coatings may be formed by initially depositing a thin conductor such as doped polysilicon, or a thin refractory metal layer of either tungsten silicide, $WSi_2$, or titanium silicide, $TiSi_2$, on the exposed silicon surfaces of a silicon substrate which has been masked with a chosen dielectric material, such as silicon dioxide. This thin conductive layer is also deposited on the exposed surfaces of any silicon dioxide mask remaining on the silicon substrate. Next, the above coated structure is transferred to an electroplating bath containing a selected titanium compound and utilizing either aqueous, non-aqueous or molten salt electrodeposition techniques. During this step, a film of titanium is plated on the conductive layer to a desired thickness determined by the particular application of the integrated circuit being manufactured.

At this point in the process, one of three process sequences is selected: (1) The process is complete with only the titanium film formed. (2) TiN is formed as described below, or (3) TiO is formed for use as an etch stop barrier as described below.

Continuing now the TiN forming process in accordance with option No. (2) above, the titanium plated structure may now be transferred to either an anneal furnace or to a rapid thermal processor (RTP) having a nitrogen containing compound therein in order to convert the titanium film to titanium nitride on the top of the highly conformal conductive film.

Another object of this invention is to provide a new and improved TiN film forming process of the type described which allows the use of titanium, for example, at the bottom and side walls of a contact via as a base upon which the metallization interconnect material is deposited and further which allows the contact via to be filled completely full with titanium in order to use the titanium as an interconnect material.

Another object of this invention is to provide a new and improved integrated circuit sub-structure having separate and distinct utility per se in silicon wafer manufacturing processes.

A feature of this invention is the provision of a new and improved process of the type described which may be controlled in such a manner to fill silicon vias, by electroplating and subsequent annealing, with either titanium, Ti, or titanium nitride, TiN, or a combination of the two.

Another feature of this invention is a provision of a new and improved process of the type described which may be used to convert a thin film of titanium on the order of 200 Angstroms to titanium nitride to act as a barrier layer for a tungsten plug fill or other metallization fill material by reacting the titanium film with nitrogen or ammonia at a controlled elevated temperature.

Another feature of this invention is a provision of a new and improved process of the type described which may also be operated to convert a thin film of titanium to titanium oxide by reacting the titanium with oxygen, $O_2$, or ozone, $O_3$, and then using the $TiO_x$ (x being variable) layer as an etch stop barrier.

Another feature of this invention is the electrodeposition of a titanium-containing film on the surface of a conductive layer selected from the group consisting of polysilicon, titanium silicide, tungsten silicide, tantalum silicide, and molybdenum silicide.

Another feature of this invention is the formation of an electroplated and annealed titanium-containing film by first electroplating in either an aqueous solution, a non-aqueous solution or a molten salt solution and then annealing in a nitrogen-containing ambient at a predetermined elevated temperature for a predetermined time.

The above objects, features, and related advantages of this invention will become more readily apparent in the following description of the accompanying drawing.

DETAILED DESCRIPTION OF THE DRAWING

Figure 1:
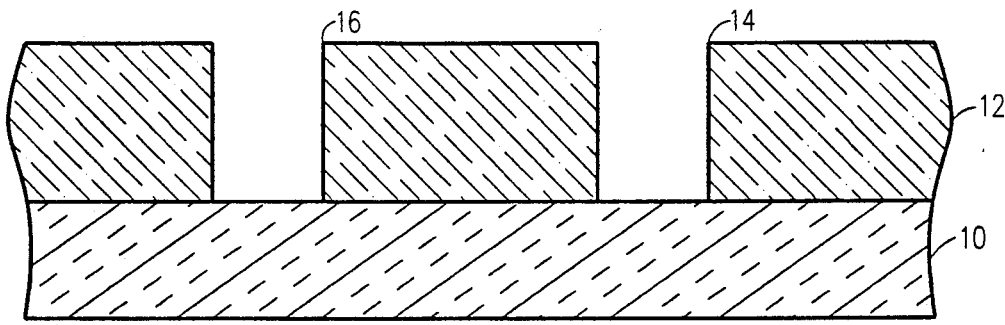
FIGS. 1 through 4 are a series of abbreviated schematic cross sectional diagrams illustrating the process step sequence in accordance with a preferred embodiment of the invention.

Referring now to FIG. 1, there is shown a silicon substrate 10 upon which a layer 12 of silicon dioxide has been formed and then etched using standard photolithographic masking and etching techniques to form openings 14 and 16 therein. The oxide layer will typically be formed to a thickness of about 0.5 to 3.0 micrometers using conventional semiconductor processing techniques and typically doped with phosphorous, boron, or both. A typical reaction would be as follows:

Equation 1:

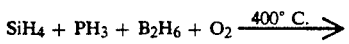

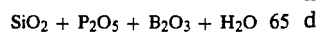

$SiO_2 + P_2O_5 + B_2O_3 + H_2O$

Figure 2:
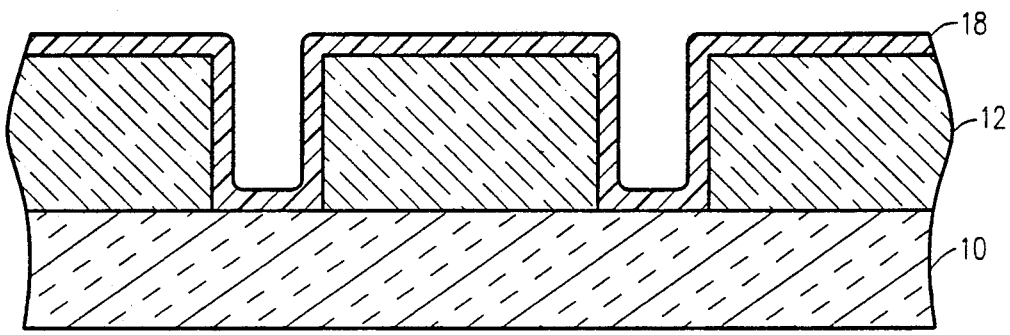

The structure of FIG. 1 is then transferred to a chemical vapor deposition station wherein a thin conductive layer 18 such as doped polysilicon, tungsten silicide, $WSi_2$, or titanium silicide, $TiSi_2$, is formed to a thickness of approximately 100 Angstroms as shown in FIG. 2. The deposition reactions which may be used for the formation of these three thin film materials are given as follows:

Equation 2:

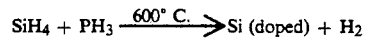

Equation 3:

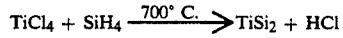

Equation 4:

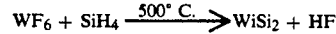

Figure 3:
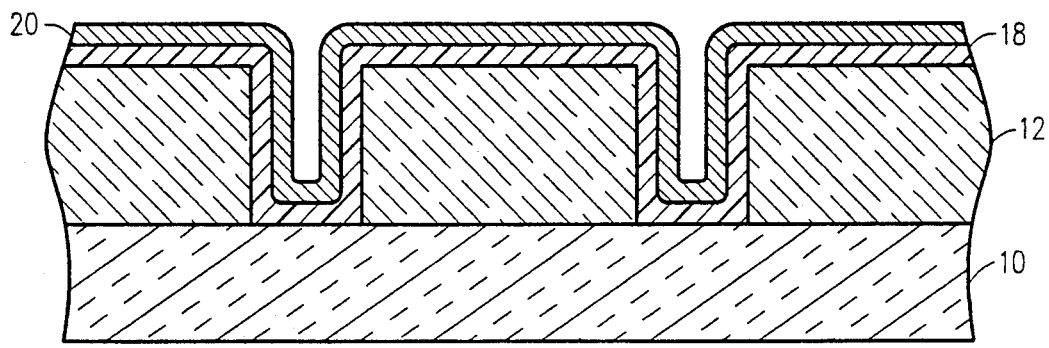

The structure in FIG. 2 is then transferred to an electroplating bath containing a chosen electroplating solution which may be either an aqueous solution, a non-aqueous solution or a molten salt solution. In carrying out this electroplating step, the conductive layer 18 is connected to an electrode to plate out a layer 20 of titanium on the surface of the previously deposited conductive layer as shown in FIG. 3. The exact thickness of the titanium layer 20 will be determined by the particular integrated circuit application of the device being manufactured and will typically be electroplated to a thickness on the order of about 200 angstroms. However, up to one micrometer of titanium may be required if filling the contact with Ti is desired. This electroplating process may be carried out using one of the electroplating techniques which are further described in a book by Jelks Barksdale entitled: *Titanium: Its Occurrence, Chemistry and Technology*, The Ronald Press Company, New York, N.Y.

These electroplating techniques are also described by Porkony and using a strongly alkaline solution of titanic oxide or titanic hydroxide in *Chemical Abstracts*, 1935, 29, 1725. These electroplating techniques are also described by Groves and Russel using organic salts of tetravalent titanium in the *Journal of the Chemical Society*, 1931, 2805 and in *Chemical Abstracts*, 1932, 26, 681. These electroplating techniques are also described by Delepinay et al using molten salts in an article entitled "Electroplating Silicon and Titanium in Molten Fluoride Media", *Journal of Applied Electrochemistry*, Volume 17, No. 2, March 1987 at pages 294–302, all of the above publications being incorporated herein by reference.

Figure 4:
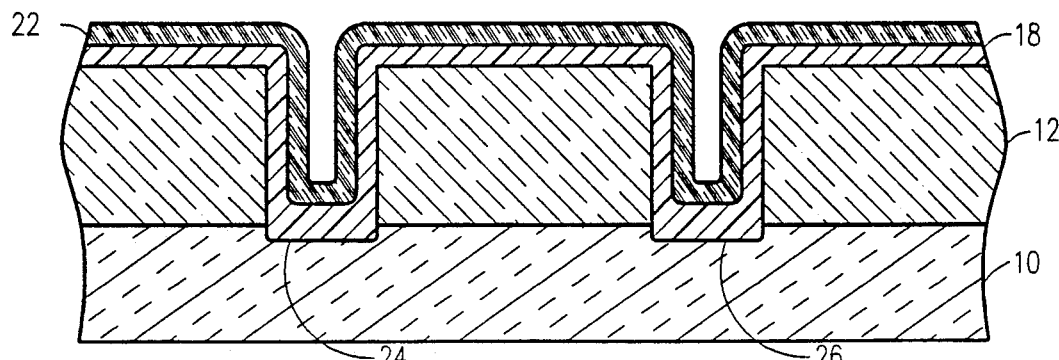

The structure shown in FIG. 3 is then transferred either to an anneal furnace or to a rapid thermal processor (RTP) which is filled with either nitrogen, $N_2$, or ammonia, $NH_3$, and heated to a predetermined elevated temperature for a predetermined time. When using an anneal furnace to convert the titanium to titanium nitride, the structure shown in FIG. 3 is heated to a temperature on the order of about 650° C. for about thirty minutes to produce a titanium nitride film 22 as shown in FIG. 4 in accordance with the following gas phase deposition reaction:

Equation 5:

-continued

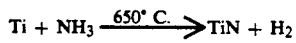

During this annealing step, the conductive layer 18 will be alloyed and sintered slightly into the surface of the silicon substrate 10 as indicated at contact regions 24 and 26, thereby providing a good low contact resistance, Rc, to the silicon substrate where mixing and/or silicide formation will take place at these contact regions 24 and 26.

When using a rapid thermal processor for annealing the structure shown in FIG. 3, the structure is rapidly heated to a temperature of about 700° C. and left in the rapid thermal processor for about thirty (30) seconds. Rapid thermal processors are generally well known in the art and are described, for example, in U.S. Pat. No. 5,032,545 of Trung T. Doan et al, assigned to the present assignee and incorporated herein by reference.

Alternatively, the structure shown in FIG. 3 may be heated in an oxygen ambient to convert the titanium layer 20 in FIG. 3 to titanium oxide in accordance with the following equation:

Equation 6:

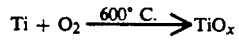

As previously indicated, this layer 22 of titanium oxide will be useful in certain etch stop applications.

Various modifications may be made in and to the above described embodiment without departing from the spirit and scope of this invention. The present invention is not limited to the particular refractory metal silicides cited above, nor to the particular chemistry of the titanium-containing electroplating solution of the preferred embodiment. For example, silicides of both tantalum and molybdenum may also be used in place of the $TiSi_2$ and $WSi_2$ described above. In addition, the TiN films produced by the present process may be used in combination with other materials such as tungsten, W, or polysilicon in filling integrated circuit contact vias. Furthermore, the present invention may be used with trench-etched silicon substrates on which the silicon dioxide mask has been removed as well as the process sequence described herein where the $SiO_2$ mask remains intact, or where other surface dielectrics such as silicon nitride, $Si_3N_4$, or oxide-nitride-oxide (ONO) layers have been deposited.

Accordingly, it is to be understood that these and other process modifications are clearly within the scope of the following appended claims.

I claim:

1. A process for improving the conformality of thin films of titanium, Ti, titanium nitride, TiN, or titanium oxide, TiO, on the surface of a semiconductor substrate having an insulating layer thereon containing contact vias which comprises the steps of:
    a. depositing a selected conductive material in said contact vias,
    b. electroplating titanium on said conductive material to either fill said vias with titanium or produce a titanium film therein, and then
    c. annealing said titanium.

2. The process defined in claim 1 which further includes annealing said titanium in the presence of a nitrogen containing ambient to convert said titanium to titanium nitride.

3. The process defined in claim 1 which further includes annealing said titanium in an oxygen ambient to form titanium oxide, $TiO_x$.

4. The process defined in claim 1 wherein said conductive material is either polysilicon or a refractory metal compound selected from the group consisting of tungsten, silicide, titanium silicide, tantalum silicide and molybdenum silicide.

5. The process defined in claim 4 wherein said electroplating is carried out in a bath containing an aqueous solution of alkaline titanic oxide or hydroxide, or a non-aqueous electroplating solution or a molten salt electroplating solution.

6. The process defined in claim 5 wherein said electroplated structure is annealed in either an anneal furnace or a rapid thermal processing unit in the presence of a nitrogen containing ambient at a controlled elevated temperature for a predetermined time.

7. The process defined in claim 1 wherein said insulating layer is a mask which is predominantly silicon dioxide, said conductive material is either polysilicon or a refractory metal compound selected from the group consisting of tungsten silicide, titanium silicide, tantalum silicide, and molybdenum silicide and said electroplating is carried out in either an aqueous solution, a non-aqueous solution or a molten salt solution.

8. A process for enhancing the conformality of titanium and titanium nitride films formed on the surfaces of silicon substrates which comprises the steps of:
    a. forming an insulating mask on the surface of a silicon substrate, said insulating mask containing vias therein which expose surface areas of said silicon substrate,
    b. forming a thin layer of a selected conductive material on the exposed surfaces of said insulating mask and on said silicon substrate,
    c. electroplating a thin layer of titanium on the exposed surfaces of said conductive material, and
    d. annealing the electroplated structure in paragraph c. above in the presence of a nitrogen-containing gas to form a layer of titanium nitride on the surface of said titanium layer.

9. The process defined in claim 8 wherein said insulating mask is formed of predominantly silicon dioxide.

10. The process defined in claim 8 wherein said conductive material is either polysilicon or a refractory metal compound selected from the group consisting of tungsten silicide, titanium silicide, tantalum silicide and molybdenum silicide.

11. The process defined in claim 8 wherein said electroplating is carried out in a bath containing either an aqueous solution, a non-aqueous solution or a molten salt solution.

12. The process defined in claim 8 wherein said electroplated structure is annealed in either an anneal furnace or a rapid thermal processing unit in the presence of nitrogen, $N_2$, or ammonia, $NH_3$, at a controlled elevated temperature for a predetermined time.

13. The process defined in claim 12 wherein said insulating mask is predominantly silicon dioxide, said conductive material is selected from the group consisting of polysilicon, tungsten silicide, titanium silicide, tantalum silicide and molybdenum silicide, and said electroplating is carried out in either an aqueous solution of alkaline titanic oxide or hydroxide, a non-aqueous solution or a molten salt solution.

* * * * *